United States Patent

Yuyama et al.

[11] Patent Number: 5,939,010
[45] Date of Patent: Aug. 17, 1999

[54] LASER MACHINING METHOD

[75] Inventors: Takayuki Yuyama; Masaru Kanaoka, both of Nagoya, Japan

[73] Assignee: Mitsubishi Denki Kabushiki Kaisha, Tokyo, Japan

[21] Appl. No.: 08/996,817

[22] Filed: Dec. 23, 1997

[30]     Foreign Application Priority Data

Sep. 24, 1997 [JP] Japan .................................. 9-258206

[51] Int. Cl.$^6$ .................................................. B23K 26/00
[52] U.S. Cl. ................ 264/400; 219/121.61; 219/121.7; 219/121.71; 264/482
[58] Field of Search ..................... 264/400, 482; 219/121.68, 121.69, 121.61, 121.7, 121.71; 425/174.4

[56]          References Cited

U.S. PATENT DOCUMENTS 3,594,261  7/1971  Broerman ................................ 264/400
3,790,744  2/1974  Bowen ..................................... 264/400
5,688,463  11/1997  Robichaud et al. ..................... 264/482
5,843,363  12/1998  Mitwalsky et al. ..................... 264/400

FOREIGN PATENT DOCUMENTS

A-0-385-911  9/1990  European Pat. Off. .
A-2-214-212  10/1972  Germany .

*Primary Examiner*—Mathieu D. Vargot
*Attorney, Agent, or Firm*—Sughrue, Mion, Zinn, Macpeak & Seas, PLLC

[57]          ABSTRACT

In the present invention, a laser beam with a prespecified oscillation frequency is divided into the arbitrary number of pulses to be irradiated to all holes in an area, and this step is repeated until the irradiation reaches a desired number of pulses, whereby an interactive time can be decided according to the number of divided pulses and a cooling period of time can be obtained, and also the number of pulses per one division is set to be a plurality of pulses, which allows an etching rate to be increased, so that the number of pulses required for machining can be reduced as compared to a case where a laser is irradiated to all the holes pulse by pulse.

3 Claims, 16 Drawing Sheets

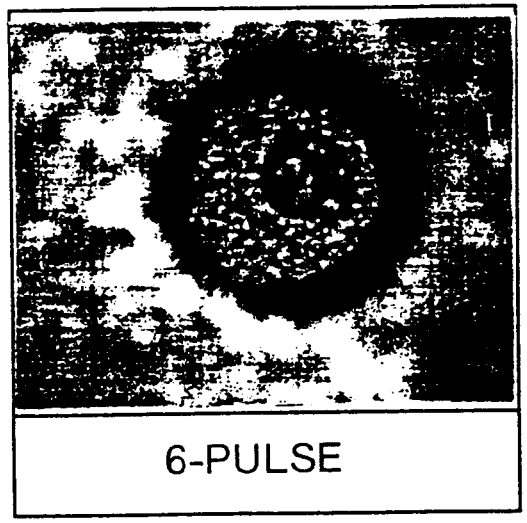
FIG.5A  6-PULSE
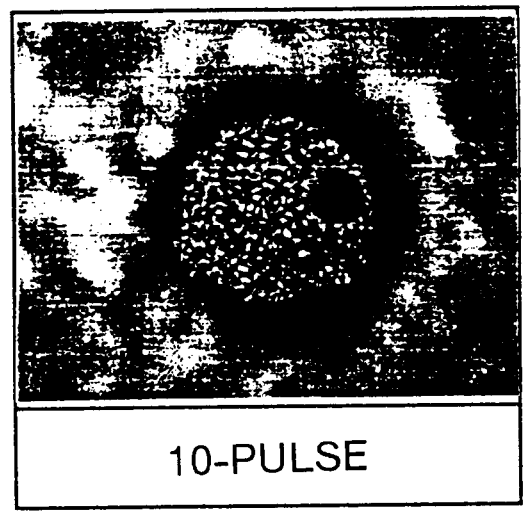
FIG.5B  10-PULSE
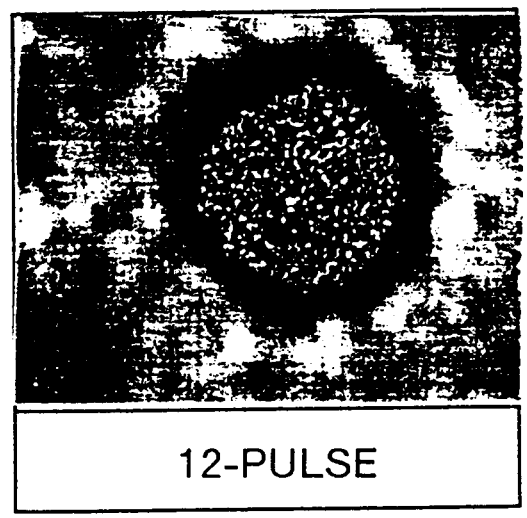
FIG.5C  12-PULSE 20mj, 10-PULSE

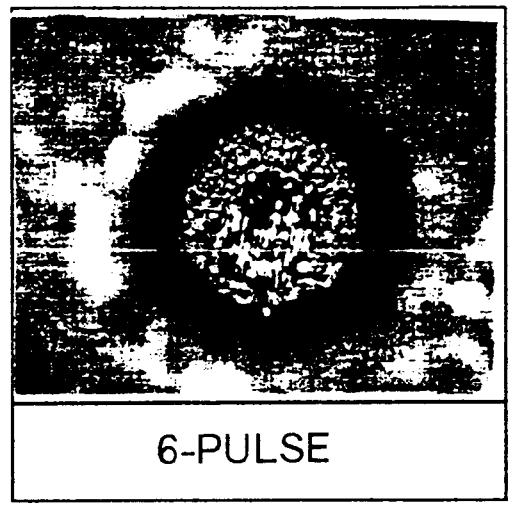
FIG.11A — 6-PULSE
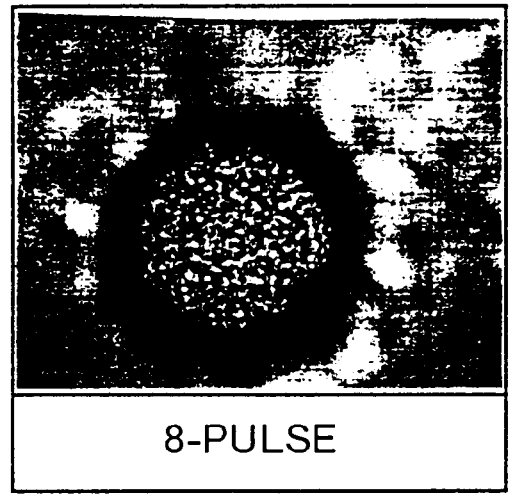
FIG.11B — 8-PULSE
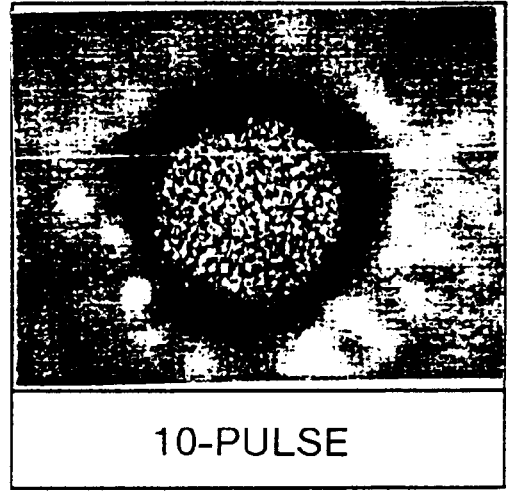
FIG.11C — 10-PULSE

6-PULSE

8-PULSE

10-PULSE

LASER MACHINING METHOD

FIELD OF THE INVENTION

The present invention relates to a laser machining method, and more particularly to a laser machining method for machining a plurality of holes using a laser beam comprising a plurality of pulses in a printed board, for example, for machining via-holes and through-holes on the printed board.

BACKGROUND OF THE INVENTION

In recent years, there has been a growing use of a laser beam in an extremely wide range in machining processes for manufacturing products and components or in some other processes. This laser beam is a specific coherent light of which amplitude and a wavelength are identical, so that the laser beam is differentiated from an incoherent light such as a natural light of which amplitude and a wavelength are different from each other.

There is a method, as one of laser machining methods based on the conventional technology, of irradiating each hole with a prespecified number of pulses according to a preset oscillation frequency when a plurality of holes are to be machined by means of using a laser beam comprising a plurality of pulses. This method is referred to as "Mode A" in this specification hereinafter.

There is also a method, as another laser machining method different from that described above, of irradiating laser beam pulses to all holes in a scanned area shot by shot, going back to the first hole after all the holes therein have been irradiated once, irradiating again laser beam pulses from the first hole shot by shot, and repeating the steps to a preset number when using the galvano scan mirror. This method is referred to as "Mode B" in this specification hereinafter.

FIGS. 15A and 15B show cross-sectional views when via-holes are machined by using a laser beam to a printed board, FIG. 15A is a view showing an insulating layer of a printed board 50 made from a resin, and FIG. 15B is a view showing an insulating layer of a printed board 62 made from an inorganic basic material impregnated with a resin.

In the figures, the printed board 50 or 62 has lands 54 for connection located on a core circuit board 52 thereof, an insulating layer is formed with an epoxy resin 56 or a glass epoxy resin 64 with glass cloth 66 mixed therein on the lands, then via-holes 58 machined with a laser beam are formed thereon, and a whole surface thereof is subjected to pattern plating 60.

As described above, the via-holes 58 formed on the printed boards 50 and 62 shown in FIG. 15A and FIG. 15B can be formed by using either one of laser machining methods of Mode A and Mode B. Especially, when the insulting layer is made from a resin as shown in FIG. 15A, there is no difference in the machining quality between Mode A and Mode B.

Therefore, machining is generally executed by using Mode A with making an oscillation frequency higher because high productivity and time reduction can be obtained in this mode. The phrase of making an oscillation frequency higher (high frequency) herein means setting the oscillation frequency equal to or higher than a frequency obtained from an inverse number of a time required for positioning a plurality of holes. If the frequency is set to a lower value than the above value, the productivity may become lower in Mode A as compared to that in Mode B.

Next description is made for the concept of machining time as described above with reference to a galvano-mirror used as an example thereof. FIG. 16 shows a diagram showing a relation between the number of pulses and machining time for each of oscillation frequencies in Mode A and Mode B. The figure shows a galvano scan that can decide a relation between an oscillation frequency and machining time and position within 2.5 msec. Because the galvano scan is capable of positioning within 2.5 msec, it means that the required oscillation frequency is 400 Hz obtained from an inverse number of the required time.

As shown in FIG. 16, assuming that the oscillation frequency is 400 Hz, the value matches a frequency (cycles of repetition) for galvano scan, so that Mode A and Mode B are equivalent so far as the machining time is concerned. If the oscillation frequency is lower than 400 Hz (the case of 200 Hz in FIG. 16), the machining time required in Mode A is longer than that required in Mode B. If the oscillation frequency is higher than 400 Hz (the case of 800 Hz in FIG. 16), the machining time required in Mode A is shorter than that required in Mode B.

However, in the laser machining method based on the conventional technology, as shown in FIG. 15B, it has been understood that there occurs a big difference in machining quality between Mode A and Mode B when a resin impregnated with an inorganic substance such as glass cloth or ceramics is used as a basic material for an insulating layer of the printed board.

At present, in the galvano scan system generally used when holes are to be machined on a printed board by means of using a carbon dioxide laser, a time required for moving and positioning a laser beam by a galvano-mirror is short with the frequency equivalent to 400 Hz at the highest speed. And for this reason, in Mode A described above, no merit is obtained in the productivity unless the frequency is set to a value higher than 400 Hz. However, in glass epoxy resin 64 shown in FIG. 15B, for example, a decomposition temperature of epoxy is about 600 K (327° C.) while a transition temperature of glass is about 1100 K (827° C.).

When materials each having a significantly different thermal feature from each other as described above are used to form an insulating layer, if the oscillation frequency of a laser beam is made higher, a time of reaction between a laser and materials becomes longer, so that the epoxy portion is selectively decomposed and removed relatively more than that of the other material. For this reason, glass fiber is protruded from a wall surface of the machined hole, so that pattern plating 60 cannot be formed with sufficient smoothness on the surface thereof, whereby the machining quality is deteriorated disadvantageously.

In contrast, when the laser machining method in Mode B described above is combined with the galvano scan system, the larger number of holes are to be machined in a galvano area, a time interval between a point of time when a hole is irradiated and a point of time when the same hole is irradiated again becomes longer. In other words, the machined material is cooled down more in proportion to the time interval, so that the interactive time is reduced, and such a phenomenon that epoxy resin is selectively decomposed and removed hardly occurs, which allows better machining quality to be obtained. However, when holes are machined in Mode B, when a plurality of pulses are irradiated per one hole, a longer machining time is required excluding a case where machining can be performed by one pulse per one hole, thus the productivity in Mode B becomes remarkably lower as compared to that in Mode A.

SUMMARY OF THE INVENTION

It is an object of the present invention to obtain a laser machining method in which machining of holes on a printed board can be executed with high quality and high productivity.

To achieve the object described above with the laser machining method according to the present invention, in the laser machining method for machining a plurality of holes by means of irradiating a laser beam comprising a plurality of pulses to a printed board, machining of holes is repeatedly executed by means of dividing the number of laser beam pulses required for machining an each hole by n (n: an integral number of 2 or more), using the first to n-th laser beam pulses in each step, and sequentially irradiating the laser beam by the number of pulses required in each step to each hole with a prespecified oscillation frequency until all the holes are machined.

With this method, machining of holes is repeatedly executed by the number of steps by dividing the number of laser beam pulses required for machining a hole on the printed board by n, using the divided laser beam pulses in each step, sequentially irradiating a laser beam by the number of pulses required in each step to each hole with a prespecified oscillation frequency until all the holes are machined. As described above, as in Mode A, also a laser beam comprising a plurality of pulses is irradiated to one hole, but the laser beam comprising the number of pulses determined as necessary for machining an each hole is not irradiated, and a laser beam comprising an arbitrary number of pulses obtained by dividing the above number of pulses is irradiated instead in one step.

Then, the machining is executed by repeating such step several times and by irradiating a required number of laser beam pulses for each hole until each hole is machined to the prespecified deepest position. An arbitrary number of pulses of laser beam allocated to each step is decided according to a material as an object to be machined, a thickness of an object board, and required quality or the other parameters.

In the laser machining method according to another feature of the present invention, a pulse width or a peak output of, or a pulse width and a peak output of a laser beam are changed during execution of the plurality of steps for machining holes.

With this feature, either a pulse width or a peak output of a laser beam, or both of them can be changed during execution of a plurality of steps for machining holes on a printed board, whereby an interactive time between a laser beam and a material as an object to be machined as well as an etching rate can appropriately be controlled, which allows machining quality to be stabilized with the productivity improved.

Other objects and features of this invention will become understood from the following description with reference to the accompanying drawings.

BRIEF DESCRIPTION OF THE DRAWINGS

FIGS. 5A to 5C are views showing state of the bottom of a machined hole when machining is executed in Mode B;

FIGS. 11A to 11C are views showing state of the bottom of a machined hole when machining is executed in Mode C;

DESCRIPTION OF PREFERRED EMBODIMENTS

Detailed description is made hereinafter for preferred embodiments of the laser machining method according to the present invention with reference to the related drawings.

In this first embodiment, description is first made for concrete data on a machining period of time as well as on machining quality when holes are to be machined under various types of conditions in Mode A or in Mode B each of which is the laser machining method, and then is made for the laser machining method according to Embodiment 1. The method is realized herein by scanning a surface of a printed board with a laser beam using a carbon dioxide laser for machining a printed board according to the galvano scan system to form a plurality of via-holes on the surface thereof.

Figure 1:
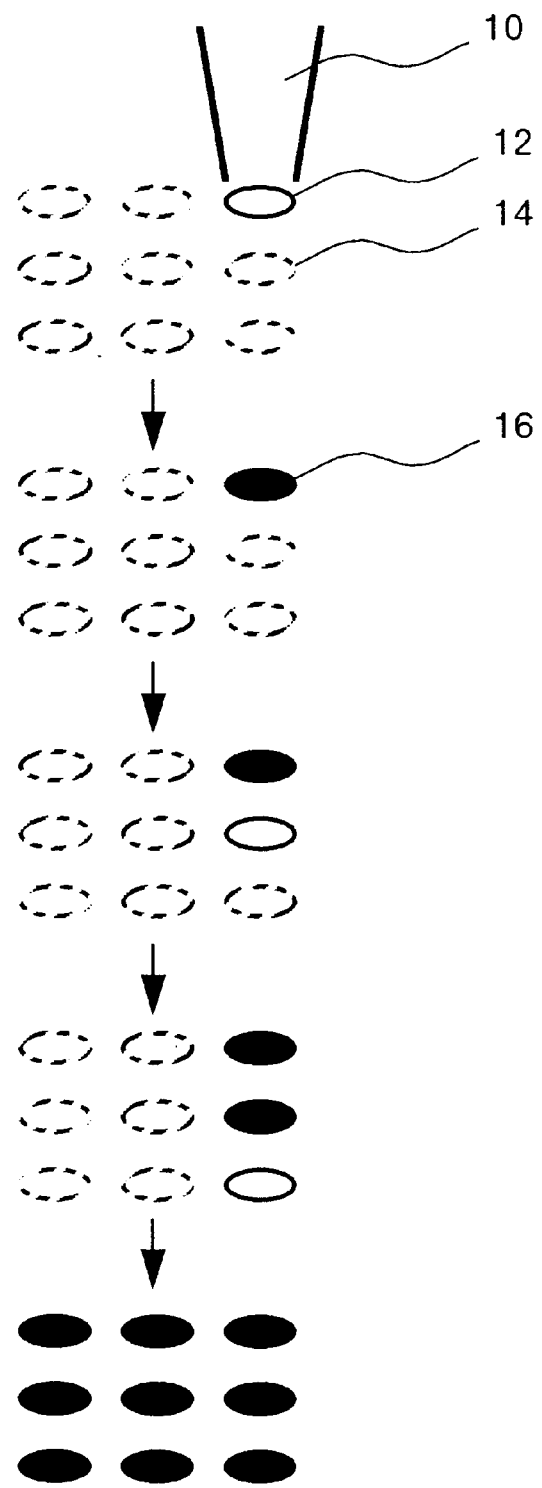
FIG. 1 is a view explaining a concept of a machining method in Mode A.
Figure 2:
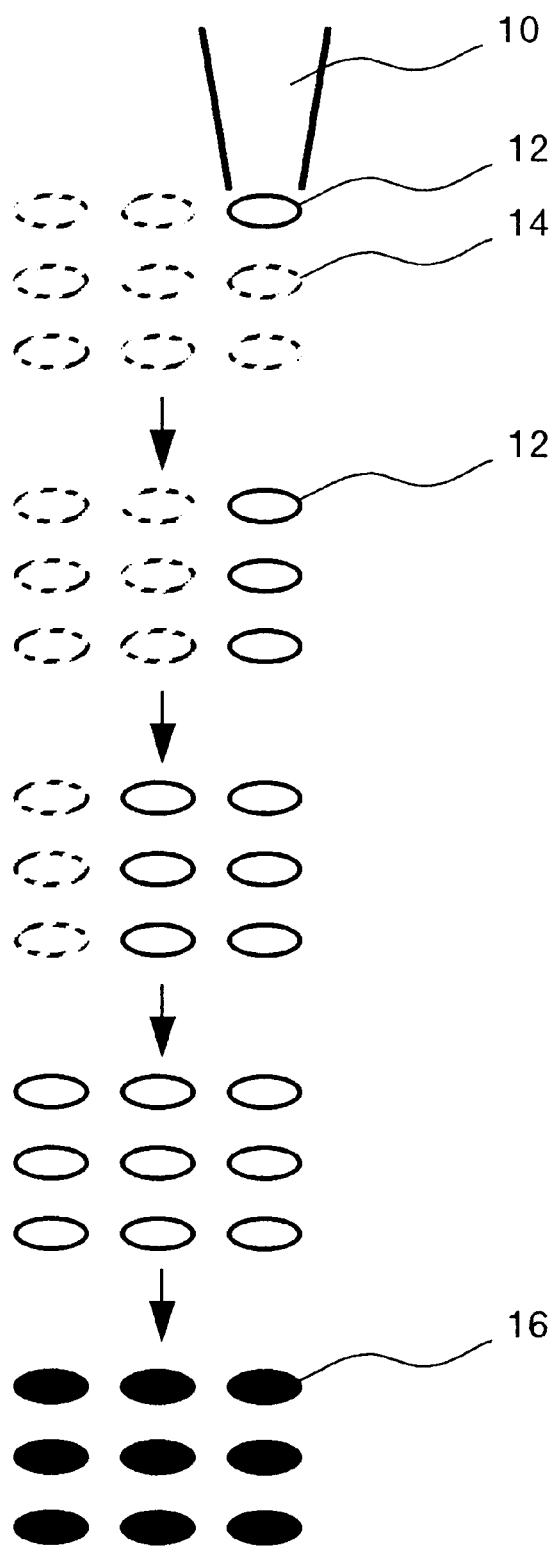
FIG. 2 is a view explaining a concept of a machining method in Mode B.

FIG. 1 shows a view explaining a concept of a machining method in Mode A, and FIG. 2 shows a view explaining a concept of the machining method in Mode B. In FIG. 1 and FIG. 2, there is shown a case where the total number of pulses of laser beam irradiated to one hole to be machined is N.

In FIG. 1, machining of holes is executed by irradiating a laser beam 10 to a plurality of positions 14 (nine positions herein) to be irradiated with a laser, in which the positions 14 each to be irradiated with a laser are shown by ellipses shown with by broken lines, a one-pulse irradiated hole 12 for irradiated with the laser beam 10 by one pulse is shown by ellipse shown with solid line, and an N-pulse-laser irradiated hole 16 obtained by irradiating the laser beam to a position 14 to be irradiated with a laser beam by N pulses as the total number of pulses is shown byablack ellipse respectively. In the laser machining method in Mode A, as shown in FIG. 1, at first, one pulse of laser beam 10 is irradiated to one of the positions 14 to be irradiated with a laser, and then N pulses are sequentially irradiated thereto (one unit of N-pulse-laser irradiated hole 16 is formed).

A laser beam irradiated position is moved to the next one of the positions 14 to be irradiated with a laser, and a laser beam is irradiated by N pulses thereto (two units of N-pulse-laser irradiated hole 16 are formed). As described above, a laser is sequentially irradiated by N pulses to all of the positions 14 to be irradiated with a laser respectively, whereby all the irradiated positions are formed into the N-pulse-laser irradiated holes 16, and then the laser machining is finished.

Similarly in FIG. 2, machining of holes is executed by irradiating a laser beam 10 to a plurality of positions 14 (nine positions herein) to be irradiated with a laser. In the laser machining method in Mode B, as shown in FIG. 2, at first, one pulse of laser beam 10 is irradiated to one of the positions 14 to be irradiated with a laser to form a one-pulse irradiated hole 12, and the laser beam irradiated position is moved to the next one of the positions 14 to be irradiated with a laser, and one pulse is irradiated thereto to form another one-pulse irradiated hole 12.

A first, one pulse of the laser beam is sequentially irradiated to each of all the positions 14 to be irradiated with a laser, then the irradiated position returns again to the first one-pulse irradiated hole 12, and then a second one pulse of laser beam is irradiated to each of the machined holes, and thus the irradiation is repeated N times, whereby all the irradiated positions (machined holes) are formed into the N-pulse-laser irradiated holes 16, and then the laser machining is finished.

Then, each machining time required for machining all the holes in Mode A and Mode B is computed. Assuming herein that the total number of holes to be machined is M, the number of pulses required for machining each hole is N, and that it is possible to position P holes per second in an area as galvano capacity, a time (At) required for machining in the method of Mode A is expressed by the following expression (1), wherein a set oscillation frequency is B:

$$At = (1/P + (N-1)/B) \times M \quad (1)$$

While a time (Bt) required for machining in Mode B is expressed by the following expression (2):

$$Bt = M \times N/P \quad (2)$$

Figure 15A:
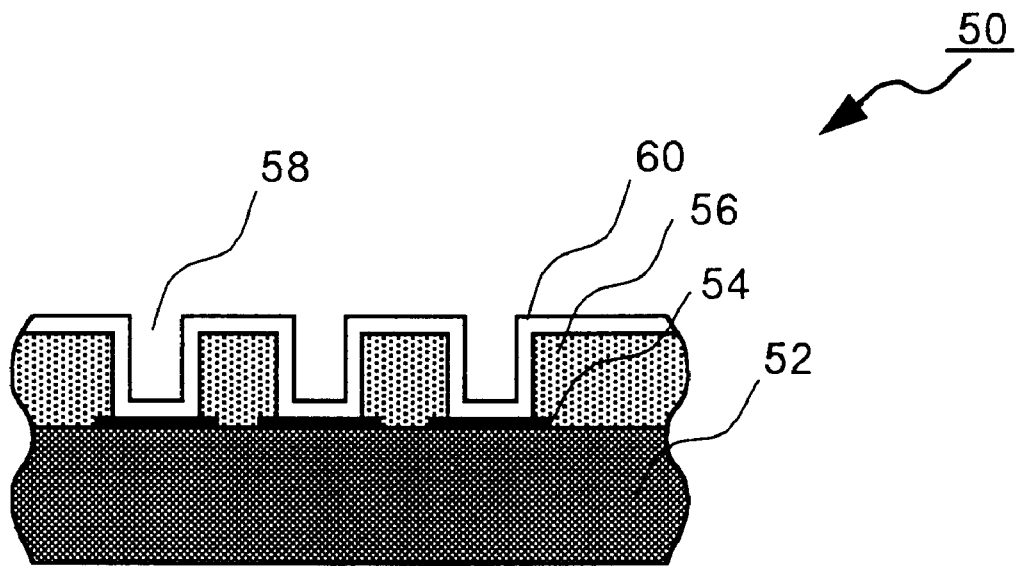
FIGS. 15A and 15B are cross-sectional views of a via-hole machined on the printed board using a laser beam.
Figure 15B:
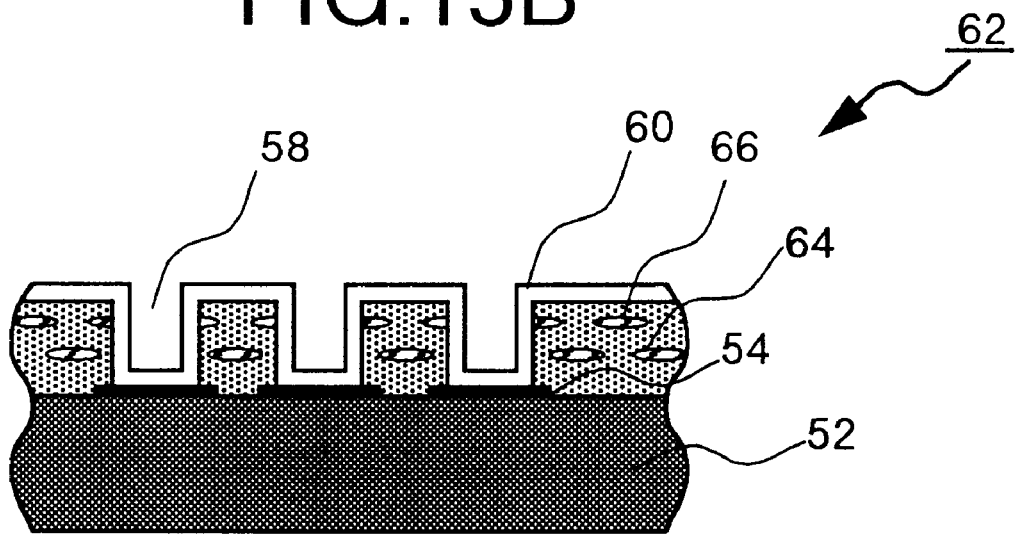
Figure 16:
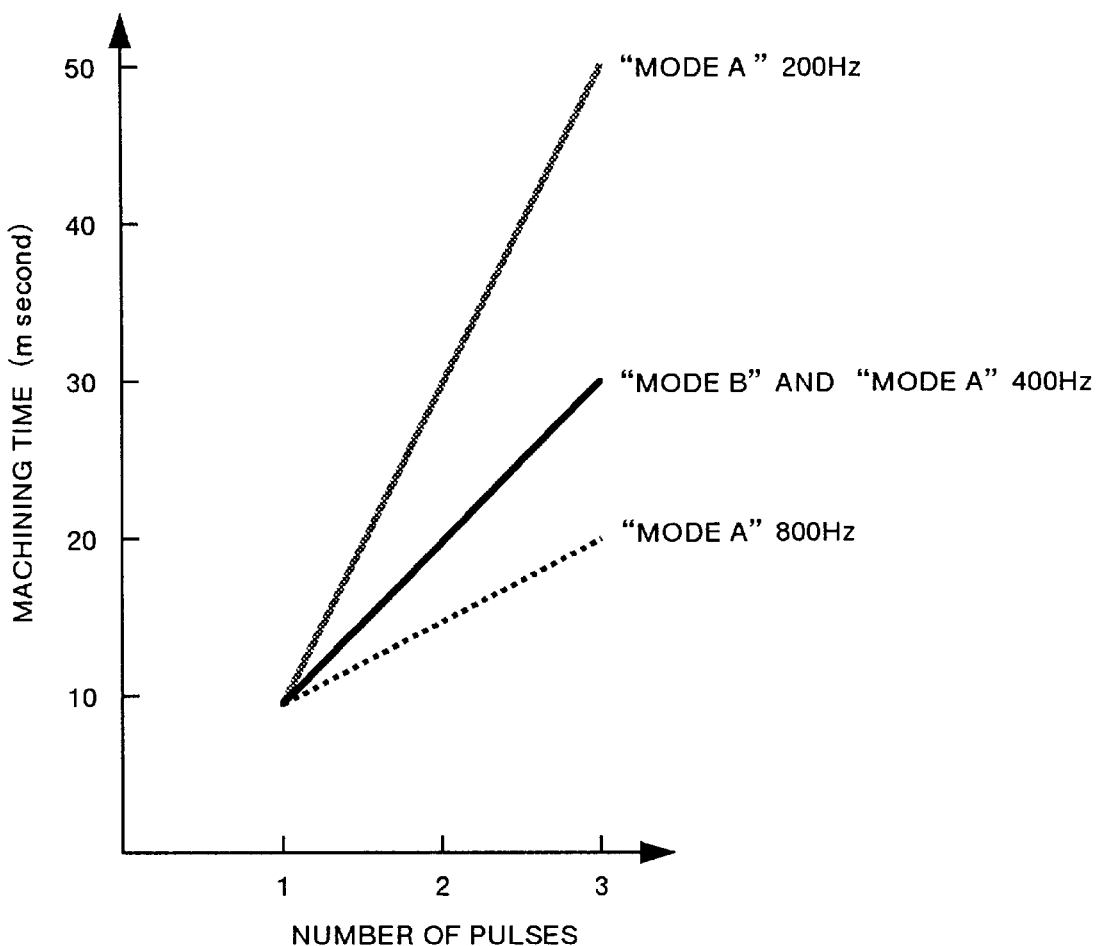
FIG. 16 is a diagram showing a relation between the number of pulses and a machining period of time to each oscillation frequency in Mode A and Mode B.

Herein, a machining time is computed assuming the conditions that a material of the insulating layer (Refer to the reference numerals 56 and 64 in FIGS. 15A and 15B) as an object to be machined is FR-4 and that 961 holes (M=961) of via-holes are to be formed on a printed board having a thickness of 0.1 mm. Assuming that the total number of pulses required for forming one via-hole is 6 (N=6), 400 holes/second (P=400) can be positioned according to the galvano capacity and an oscillation frequency is 1000 Hz, a machining time (At) in Mode A is obtained by computing through the expression (1) in which those values are substituted:

$$At = (1/400 + (6-1)/1000) \times 961 = 7.2 \text{ seconds}$$

While a machining time (Bt) in Mode B is obtained when those values are substituted in the expression (2):

$$Bt = 961 \times 6/400 = 14.4 \text{ seconds}$$

As a result, it is found that the Mode B requires the machining time around twice as long as the Mode A.

Next description is made for machining quality when machining of holes is executed on an actual printed board. Herein, via-holes (φ 0.3 mm) are formed on a printed board with the insulating layer made from FR-4 and the board thickness of 0.1 mm, and also with the insulating layer laminated on an outer layer thereof made from copper foils each having a thickness of 12 μm. FIGS. 3A to 3C and FIGS. 4A to 4C show each state of machined holes when they are machined in Mode A.

Figure 3A:
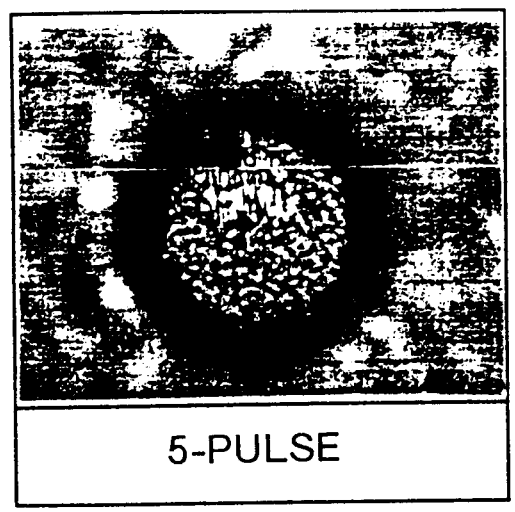
FIGS. 3A to 3C are views showing state of the bottom of a machined hole when machining is executed in Mode A.
Figure 3B:
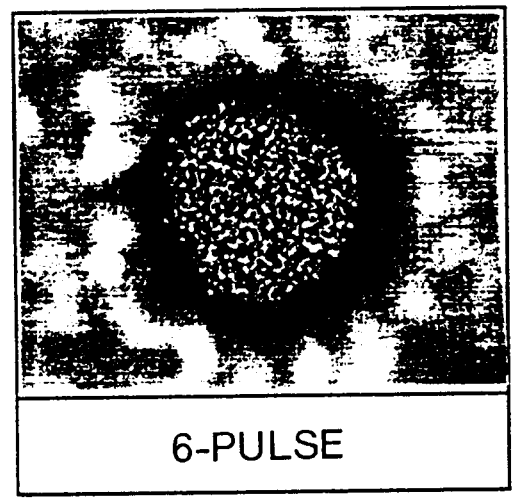
Figure 3C:
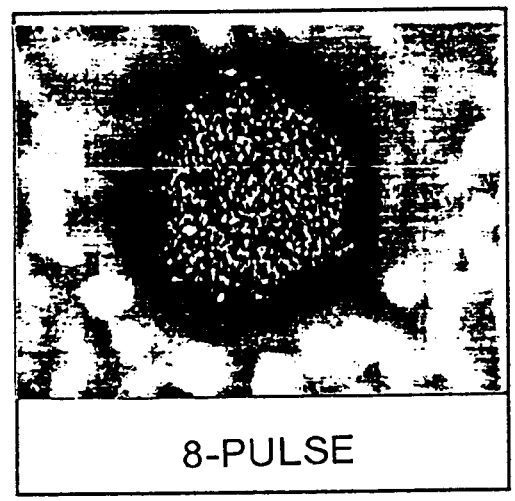
Figure 4A:
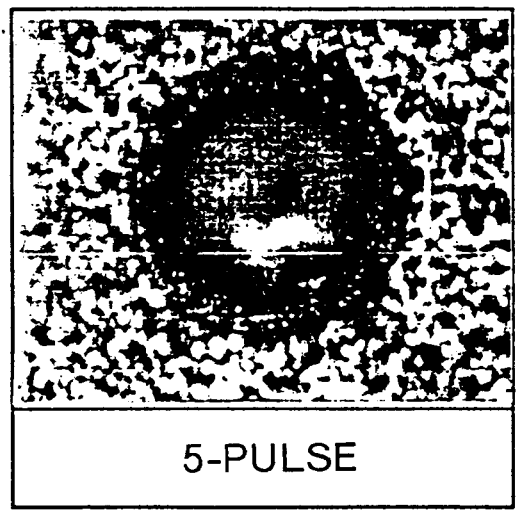
FIGS. 4A to 4C are views showing state of the surface around the machined hole when machining is executed in Mode A.
Figure 4B:
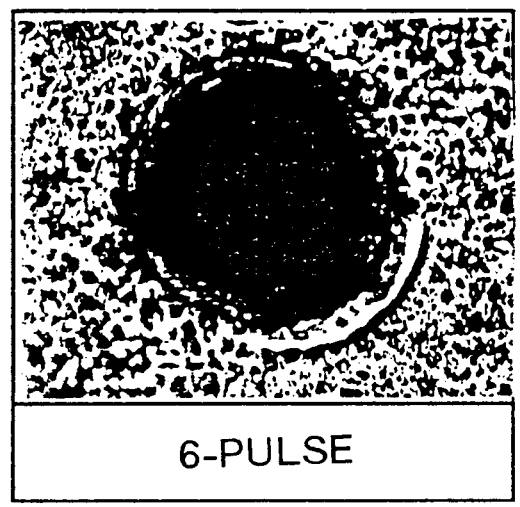
Figure 4C:
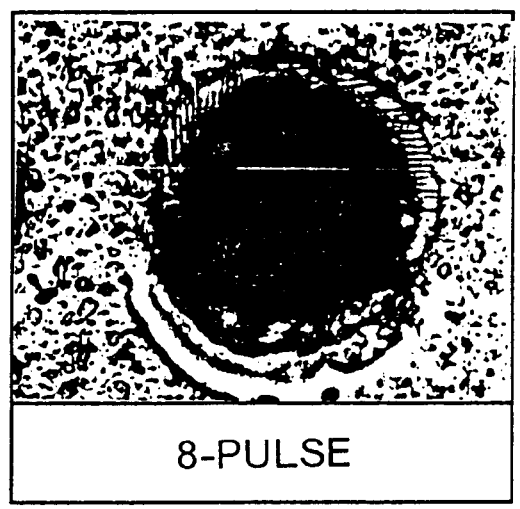

FIGS. 3A to 3C are views each showing a state of the bottom of a machined hole, and FIGS. 4A to 4C are views each illustrating a state of the surface around the machined hole, and FIG. 3A and FIG. 4A each show a case where five pulses are irradiated, FIG. 3B and FIG. 4B show a case of irradiation with six pulses each, and FIG. 3C and FIG. 4C show a case of irradiation with eight pulses each respectively. It should be noted that only one machined hole is shown in FIGS. 3A to 3C and FIGS. 4A to 4C, respectively, but 961 units of holes are actually machined (galvano positioning is 400 holes per sec). The machining conditions required for machining as above include energy for one pulse of 15 mJ, apulse width of 50μ sec, and an oscillation frequency of 1000 Hz.

As shown in FIG. 3A, it is observed that any glass cloth not yet removed exists on the copper foil of the bottom section of the hole in the case of irradiation with five pulses. When the number of laser beam pulses is increased to six pulses or eight pulses, the glass cloth is removed as clearly shown in the figures.

A result of observation of the surface around the hole shown in FIGS. 4A to 4C shows that the glass is spheroidized and deposited on the edge of the hole, and when the number of pulses is increased from five to six and further to eight, it is found that there occurs a thermal effect to an epoxy layer of the surface thereof. The machining time in this case is around 7.2 seconds (six pulses), so that it is clear that the productivity is sufficiently good, but machining quality is not good enough.

Then, FIGS. 5A to 5C and FIGS. 6A to 6C each show state of each machined hole when the board is machined in Mode B. In this case, via-holes are also formed on the printed board with the insulating layer made from FR-4 and the board thickness of 0.1 mm, and also with the insulating layer laminated on the outer layer thereof made from copper foils each having a thickness of 12 μm.

Figure 6A:
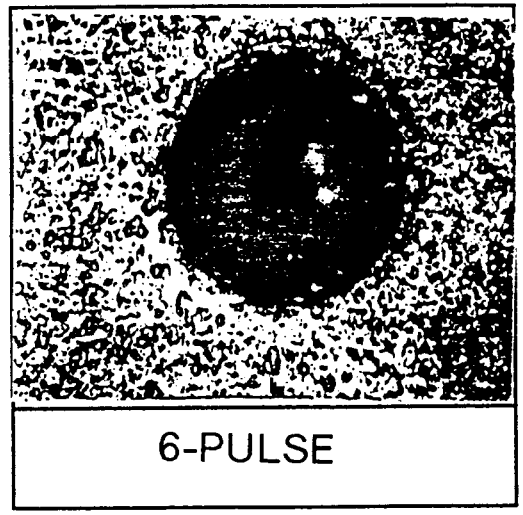
FIGS. 6A to 6C are views showing state of the surface around the machined hole when machining is executed in Mode B.
Figure 6B:
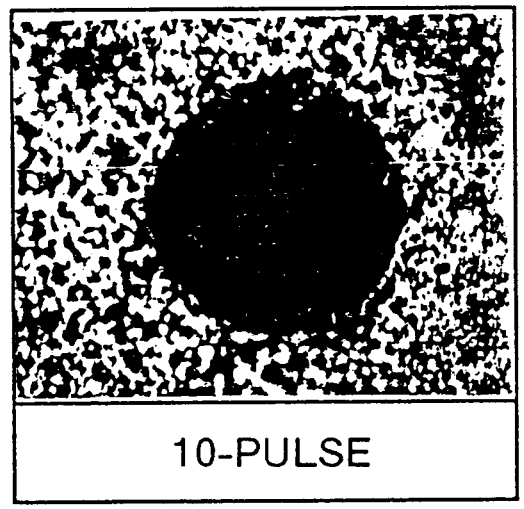
Figure 6C:
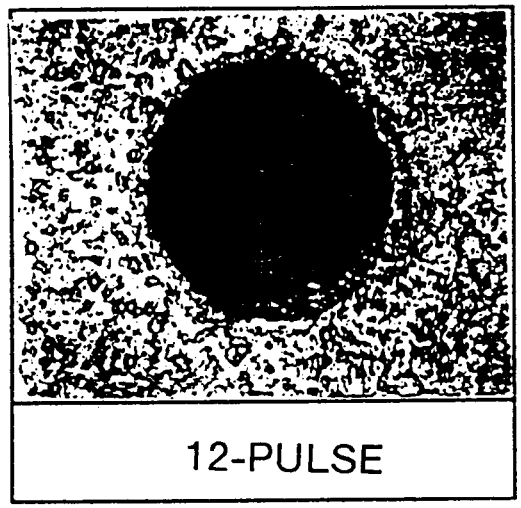

FIGS. 5A to 5C are views each showing state of the bottom of a machined hole, and FIGS. 6A to 6C are views each showing a state of the surface around the machined hole, and FIG. 5A and FIG. 6A each show a case of irradiation with six pulses, FIG. 5B and FIG. 6B show a case of irradiation with ten pulses each, and FIG. 5C and FIG. 6C show a case of irradiation with 12 pulses each respectively. It should be noted that only one machined hole is shown in FIGS. 5A to 5C and FIGS. 6A to 6C, respectively, but 961 units of holes are actually machined. The machining conditions required in the cases include energy for one pulse of 15 mJ, a pulse width of 50μ sec. It should be noted that there are 961 units of holes to be machined, so that a frequency used for repeating a pulse for one hole is 0.4 Hz.

As shown in FIG. 5A and FIG. 5B, it is observed that any glass or a block of resin each not yet removed exists on the copper foils of the bottom section of the hole in the case of irradiation with six and 10 pulses. Therefore, the number of laser beam pulses is increased to 12 pulses to remove the cloth or the like therefrom, as shown in FIG. 5C, and from this fact, it is clear that those substance can be removed.

A result of observation of the surface around the hole shown in FIGS. 6A to 6C shows that there is a small amount of glass-spheroidized substance deposited on the edge of the hole and that there occurs no thermal effect to an epoxy layer of the surface thereof even if the number of pulses is increased. The machining time in this case is, however, around 28.8 seconds according to a result of calculation of 961×12/400, so that it is clear that the machining quality is sufficiently good, but the productivity (which requires around four times as long as Mode A) gets worse.

Figure 7:
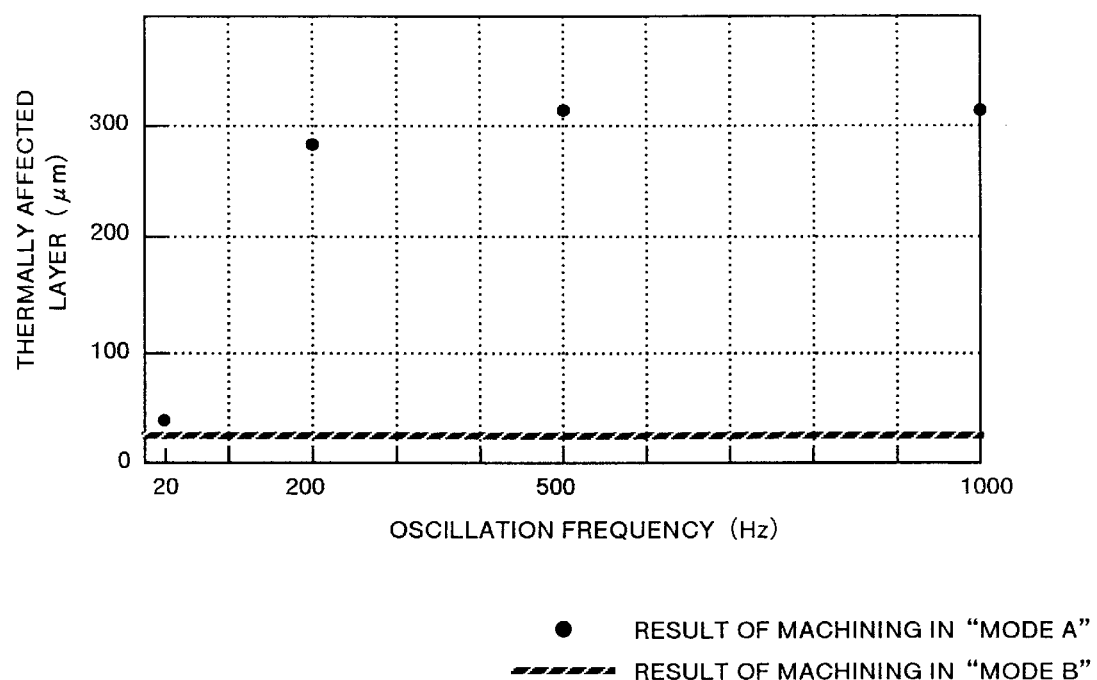
FIG. 7 is a view showing a result when machining is executed by making an oscillation frequency lower in Mode A.

FIG. 7 shows a result of a case, where an oscillation frequency is lowered and holes are machined therewith for the purpose of reducing the interactive time between a laser and a material to improve the machining quality in the method of Mode A. As shown in FIG. 7, the figure shows a comparison of each machining quality (thermal effect) among cases where each oscillation frequency is set to 1000 Hz, 500 Hz, 200 Hz, and 20 Hz. Also data for Mode B is further shown for comparison to data in Mode A.

FIG. 7 shows the longest distance from the hole edge on the surface thereof to a thermally affected layer to obtain quantitative data. As clearly understood from FIG. 7, there is substantially no difference in each size of the thermally affected layer when machined at a frequency in a range from 1000 Hz to 200 Hz, and the size is substantially the same as a result of machining in Mode B at a frequency of around 20 Hz. However, the machining time required for machining with an oscillation frequency of 20 Hz is 243 seconds as obtained by computing through the expression of (1/400+(6−1)/20)×961, so that the productivity in Mode A becomes further lower than that in Mode B.

Figure 8:
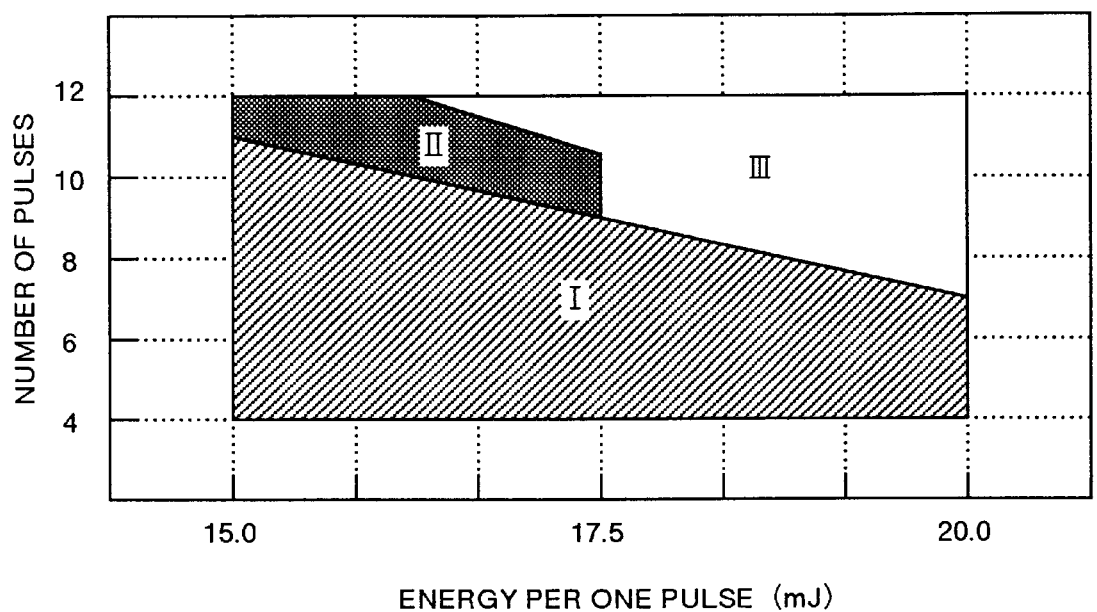
FIG. 8 is a view showing a result when machining is executed by making energy of a pulse higher in Mode B.

FIG. 8 shows a result of a case where energy of a pulse is made higher to improve the productivity in Mode B. Herein, energy of a laser beam pulse is changed in three stages such as 15 mJ, 17.5 mJ, and 20 mJ, and the Y axis of the figure indicates the number of pulses while the X axis thereof indicates energy per one pulse. Three regions (I, II, III) are shown in FIG. 8, and resin remains in the bottom section of a hole in the region I because both the number of pulses and the energy are not sufficient, a result of machining with high quality can be obtained in the region II because the number of pulses and the energy are appropriate, and copper foils in the outer layer of the printed board are damaged in the region III because the number of pulses and the energy are excessive (FIG. 9 shows an appearance of damages given to the copper foil in the region III).

Figure 9:
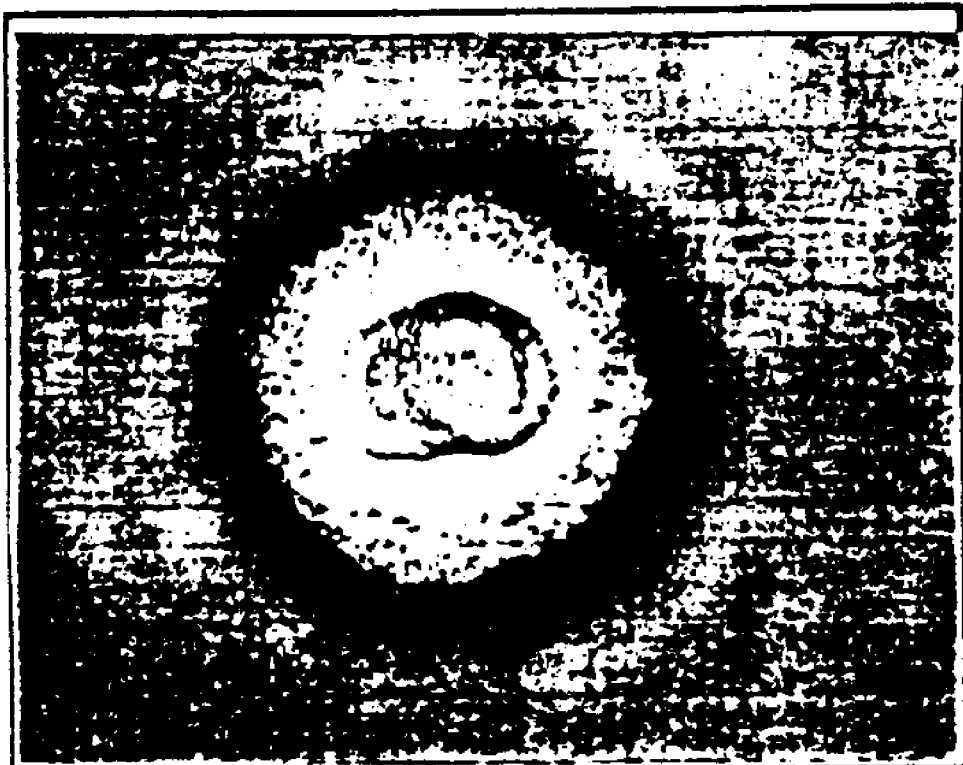
FIG. 9 is a view showing an appearance when copper foil is damaged in an area III shown in FIG. 8.

As shown in FIG. 8 and FIG. 9, it is clear that the number of pulses required for removing resin on the copper foils may be small if energy per one pulse is made higher, but that the copper foils can easily be damaged. In this case, the condition 10 pulses of 17.5 mJ is regarded as a good one, but the machining time in this case is 24 seconds as obtained by computing through the expression of 961×10/400, so that the productivity is slightly improved as compared to that in the case of 16 mJ. However, the machining time is around 3.3 times longer as compared to that in Mode A.

As described above, a result of study of concrete data on a machining time and machining quality obtained when machining of holes is executed under various types of condition for Mode A and Mode B as shown in FIG. 1 to FIG. 9, and it has been found that both Mode A and Mode B are not preferable in either the high quality or the high productivity.

Figure 10:
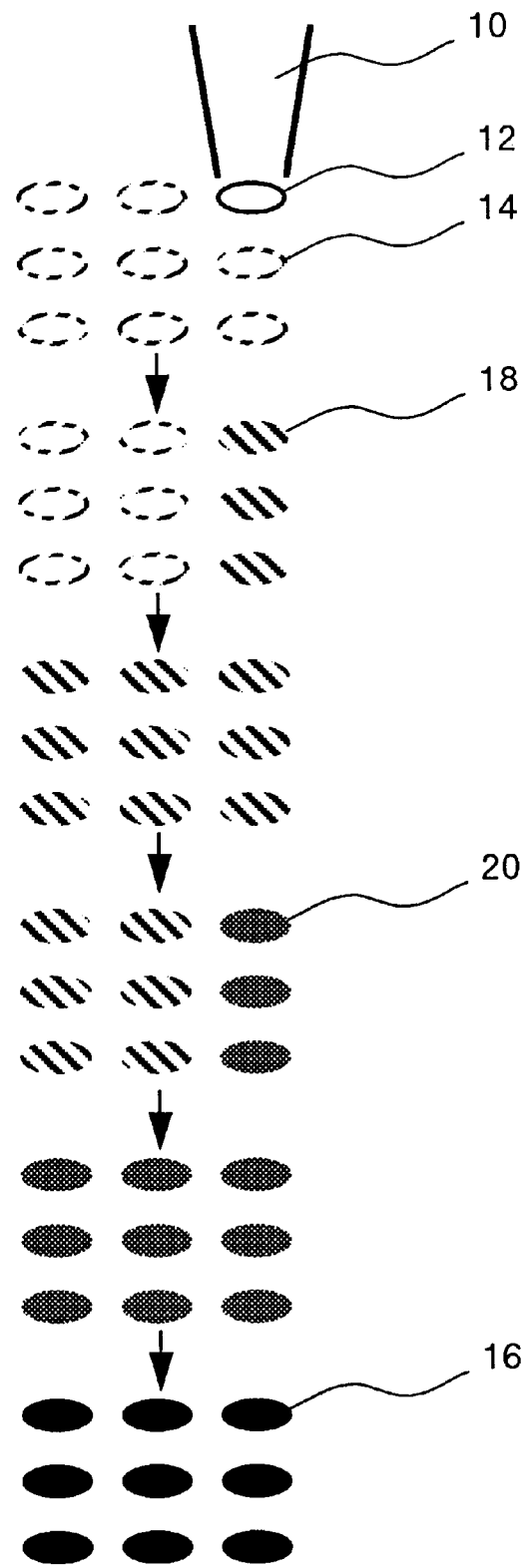
FIG. 10 is a view showing a concept of a laser machining method according to Embodiment 1.

Next detailed description is made for the laser machining method according to Embodiment 1. FIG. 10 shows a view of concepts for the laser machining method according to Embodiment 1. In a first step in FIG. 10, like in Mode A, the n1 pulse is irradiated to a position at a prespecified oscillation frequency (the hole 18 irradiated by the n1-pulse laser beam indicated by an ellipse with slashes therein in the figure). Namely, all holes in an area are sequentially irradiated with the pulse n1 at an oscillation frequency.

At a point of time when the processing comes to the end, the processing shifts to a second step, and all of the holes in the area is sequentially irradiated by the n2 pulses, starting from the first hole again, at the prespecified oscillation frequency (hole 20 irradiated by (n1+n2) pulses indicated by an ellipse in a halftone in the figure). As described above, the irradiation is repeated until the last step in which the laser beam is irradiated by nn pulses. The total number of pulses at that time is N=n1+n2+ . . . +nn. Wherein n indicates an integral number used to divide N (the total number of pulses). As described above, steps of dividing N pulses by n and irradiating a laser beam by the number of pulses required in each step to a hole in Mode A are repeated in Embodiment 1. In the specification, this laser machining method is described as Mode C.

It should be noted that this Mode C can be regarded as an aggregate of Mode A divided by n, so that, in Mode C, steps of irradiating by n1, n2, . . . , nn pulse are referred to as Mode An1, Mode An2, . . . , Mode Ann, respectively.

A machining time (Ct) in Mode C according to Embodiment 1 can be expressed by the following expression (3).

$$Ct=(n/P+N/B)\times M \qquad (3)$$

In the case above, 961 units (M=961) of via-hole are formed on a printed board with the insulating layer made from FR-4 and thickness of 0.1 mm, and it is assumed that the number of pulses required for forming one of the via-holes is 6 (N=6) and that 400 holes per sec (P=400) can be positioned according to galvano capacity.

The oscillation frequency in this case is 1000 Hz, and a machining time (Ct) in Mode C required for laser-machining with 2 pulses obtained by dividing six pulses by three pulses respectively is obtained by computing through the expression (3) in which the values are substituted:

$$Ct=(3/400+6/1000)\times 961=13 \text{ seconds}$$

and as a result, the machining time is around 1.8 times longer as compared to that in Mode A, and is around 0.9 times longer than that in Mode B.

FIGS. 11A to 11C and FIGS. 12A to 12C show each state of machined holes when laser machining is executed thereto in Mode C to the printed board having the same parameters as those in FIG. 3A to 3C and FIGS. 4A to 4C (the printed board with the insulating layer made from FR-4, and the thickness of 0.1 mm, and also with the insulating layer laminated on the outer layer thereof made from copper foils each having a thickness of 12 μm). Machining conditions in that case are also the same as those in FIGS. 3A to 3C and FIGS. 4A to 4C, so that energy for one pulse is 15 mJ and a pulse width is 50μ sec.

Figure 12A:
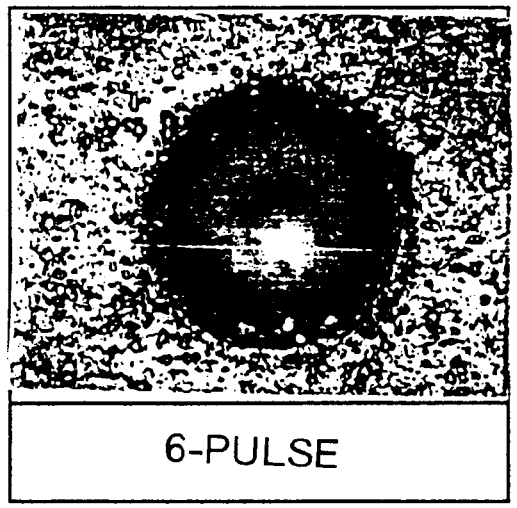
FIGS. 12A to 12C are views showing state of the surface around the machined hole when machining is executed in Mode C.
Figure 12B:
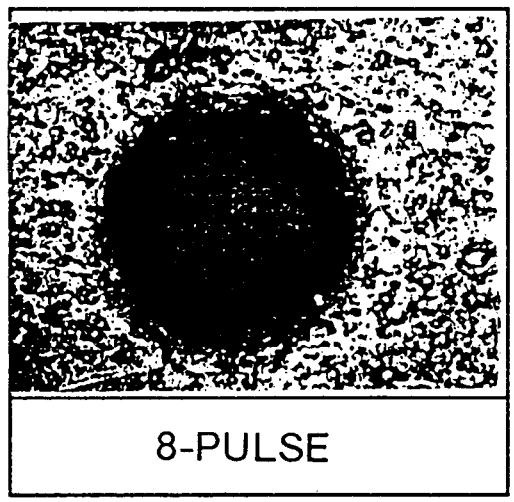
Figure 12C:
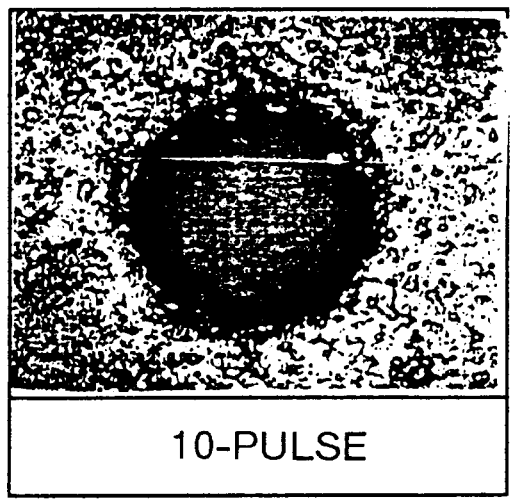

FIG. 11A and FIG. 12A each show a case of a laser beam comprising six pulses, FIG. 11B and FIG. 12B show a case of laser beam comprising eight pulses, and FIG. 11C and FIG. 12C show a case of laser beam comprising 10 pulses, respectively. Pulses irradiated in each step in Mode C are divided by two pulses in Embodiment 1, so that three divisions are obtained in the case of irradiation with six pulses, four divisions are obtained in the case of irradiation with eight pulses, and five divisions are obtained in the case of irradiation with 10 pulses, respectively.

In Embodiment 1, as a result of laser-machining in the Mode C, it is observed, as shown in FIGS. 11A to 11C, that glass cloth not yet removed remains on the copper foils on the bottom section of the hole in the case of irradiation with six pulses in FIG. 11A, but when irradiation is made with eight pulses as shown in FIG. 11B or 10 pulses as shown in FIG. 11C, the glass cloth can be removed.

Figure 13:
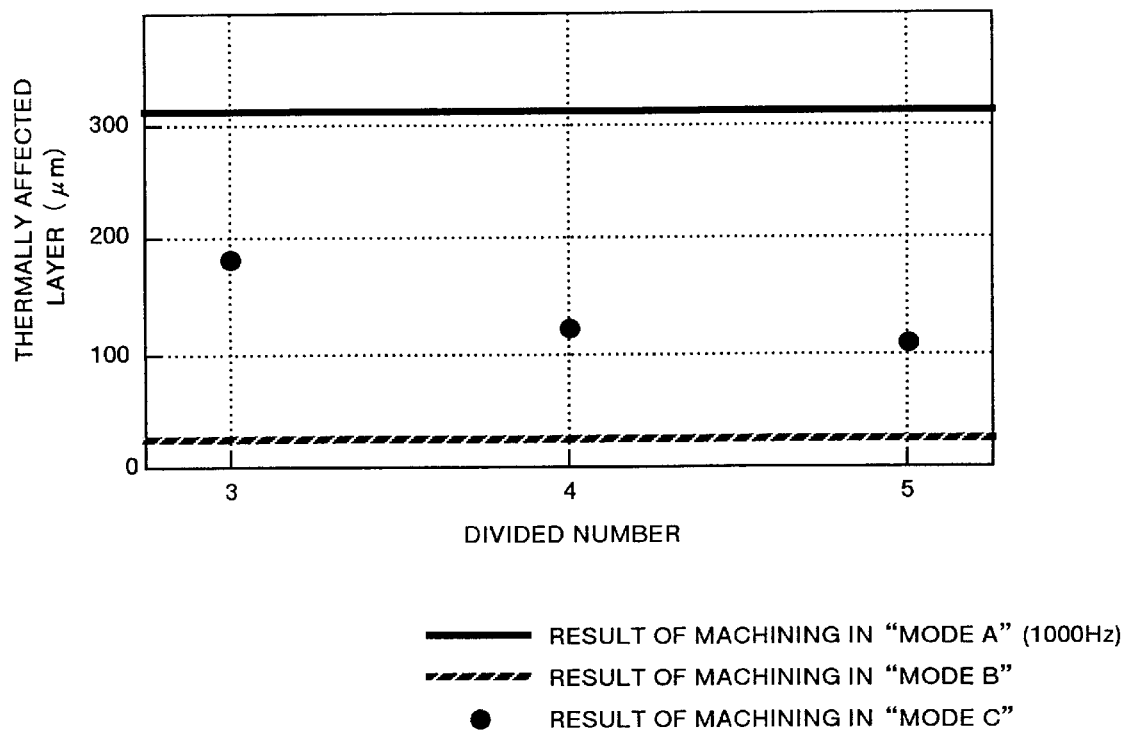
FIG. 13 is a view showing a rate of each of thermally affected layers in Mode A, Mode B, and in Mode C.

As shown in FIGS. 12A to 12C, it is understood from observation of the state of the surface around the machined hole that a less amount of granular glass particles is deposited on the edge of the hole as compared to that in Mode A (Refer to FIGS. 4A to 4C) irrespective of the number of pulses irradiated thereto, and that a thermally affected layer on an epoxy layer of the surface is smaller. FIG. 13 is a view showing a rate of each of thermally affected layers as those in FIGS. 5A to 5C, and it is found that the thermally affected layer is larger than that in Mode B, but is smaller than that in Mode A. As a result, it can be said that the machining quality in Mode C is between Mode A and Mode B.

A machining time (Ct) is one fourth in a case of eight pulses, so that the expression is described as Ct=(4/400+8/1000)×961=17.3 seconds, the productivity is 2.4 times longer than that in Mode A, and 0.6 times longer than that in Mode B (when 12 pulses are irradiated in Mode B). As a result, it can be said that the machining time in Mode C is between Mode A and Mode B.

As described above, with Embodiment 1, a result of laser machining in Mode C stands substantially a midway between Mode A and Mode B in the productivity, while it is possible to obtain a sufficient result of machining that is close to a machining result in Mode B in the machining quality. The laser machining based on the conventional technology has been executed in either Mode A or Mode B, so that both the sufficient machining quality and productivity cannot be obtained at the same time, but in Embodiment 1, it is possible to obtain both of the high machining quality and the high productivity, which allows laser machining with higher quality to be executed.

Figure 14:
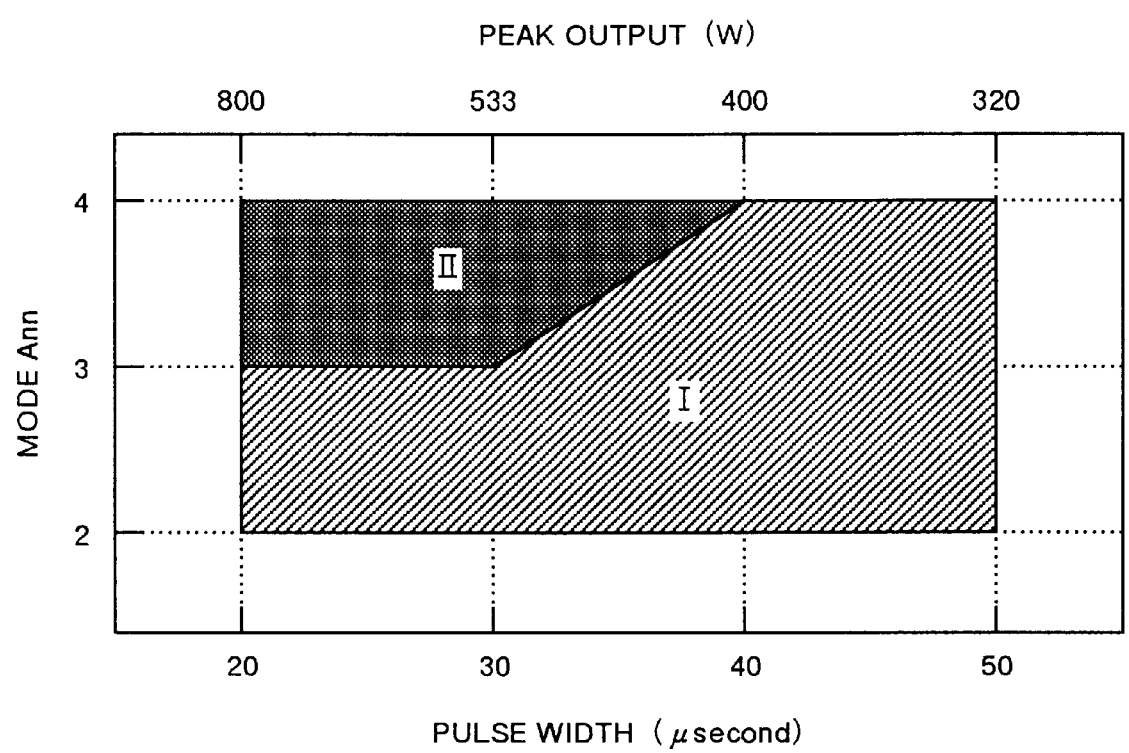
FIG. 14 is a view showing effects due to changing of a pulse width and a peak output in Mode C.

Next description is made for Embodiment 2 according to the present invention with reference to FIG. 14. At first, as described in relation to laser machining with higher energy in Mode B in Embodiment 1, the maximum value of energy per one pulse is decided in consideration of damage to the copper foil. This damage to be taken into consideration is determined according to the thermal capacity decided by a thickness of the copper foil and a diameter of a land as well as by an absorption rate of a laser beam obtained from the surface condition of the copper foil on the surface to be machined.

When glass epoxy resin as an insulating layer is machined with a laser beam, higher energy is required as compared to that in a case of machining an insulating layer made of one type of resin (e.g. epoxy resin), which causes the damage to the copper foil. Also, when laser machining is executed in Mode A at that time, pulses are continuously irradiated, so that cooling is not much effective, and damage to the copper foil further easily occurs.

FIG. 14 shows effects obtained by changing a pulse width and peak output in Mode C. FIG. 14 shows, of Mode An1 to Mode An4 in each divided mode of Mode C divided into four sections, each result of effects in three regions like in FIG. 8 obtained by changing a pulse width per one pulse and peak output in Mode An2 to Mode An4 from those in Mode An1 (assuming that energy per one pulse is constant).

In FIG. 14, the region I is one in which resin remains in the bottom section of a hole, and the region II is one in which a result of machining with high quality can be obtained. It should be noted that a region III is one in which the copper foil on the outer layer is damaged, but it is not shown in the figure. As shown in FIG. 14, it is understood that high quality machining can be executed with the small number of divisions by executing laser machining in Mode An3 with shorter pulses and higher peak. However, shorter pulses and high peak make a temperature at a machining point increase, so that damage to the copper foil occurs and a plasma occurs with the removing capability reduced, and for this reason it is necessary to select an appropriate value as required according to a type of work as well as to a required machining quality.

As described above, with Embodiment 2, when laser machining is to be executed in Mode C, it is possible to control an interactive time between a laser beam and a material of a work as required by changing a pulse width per one pulse and a peak output during execution of machining steps divided into a plurality steps, and the work can be subjected to high quality laser machining by adjusting a balance between stability of machining quality and improvement of productivity.

As described above, with the laser machining method according to the present invention, holes on a printed board can be formed with high quality and high productivity.

With the laser machining method according to another feature of the present invention, it is possible to appropriately control an interactive time between a laser beam and a material of an object to be machined as well as an etching rate, which allows stability of machining quality and improvement of the productivity.

This application is based on Japanese patent application No. HEI 9-258206 filed in the Japanese Patent Office on Sep. 24, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method for machining a plurality of holes using a laser beam comprising the steps of:
   (a) dividing a total number N of laser beam pulses required for machining each of the plurality of holes by an integral number n which is greater than or equal to 2 and less than N;
   (b) sequentially irradiating each of the plurality of holes with n pulses of a laser beam with a prespecified oscillation frequency to machine the plurality of the holes; and
   (c) repeating step (b) until each of the plurality of holes has been irradiated with the total number N of laser beam pulses required for machining.

2. A laser machining method according to claim 1 wherein step (b) further comprises changing a pulse width or a peak output of said laser beam.

3. A laser machining method according to claim 1, step (b) further comprises changing a pulse width and a peak output of said laser beam.

* * * * *